(12) United States Patent
Wiseman et al.

(10) Patent No.: US 12,387,958 B2
(45) Date of Patent: Aug. 12, 2025

(54) PERIMETER FRAME FOR SPACING RETICLE PODS

(71) Applicant: ENTEGRIS, INC., Billerica, MA (US)

(72) Inventors: Brian Wiseman, Glencoe, MN (US); Russ V. Raschke, Chanhassen, MN (US); Paul J. Magoon, Colorado Springs, CO (US); Huaping Wang, Eden Prairie, MN (US)

(73) Assignee: ENTEGRIS, INC., Billerica, MA (US)

( * ) Notice: Subject to any disclaimer, the term of this patent is extended or adjusted under 35 U.S.C. 154(b) by 2 days.

(21) Appl. No.: 18/370,570

(22) Filed: Sep. 20, 2023

(65) Prior Publication Data

US 2024/0096670 A1 Mar. 21, 2024

Related U.S. Application Data

(60) Provisional application No. 63/408,451, filed on Sep. 20, 2022.

(51) Int. Cl.
*H01L 21/673* (2006.01)

(52) U.S. Cl.
CPC .. *H01L 21/67359* (2013.01); *H01L 21/67386* (2013.01)

(58) Field of Classification Search
CPC . G03F 1/38; G03F 1/66; H01L 21/673; H01L 21/67359; H01L 21/67386; H01L 21/67
USPC ...................................................... 206/316.1
See application file for complete search history.

(56) References Cited

U.S. PATENT DOCUMENTS

| | | | |
|---|---|---|---|
| 6,216,873 B1 | 4/2001 | Fosnight | |
| 10,281,815 B2 * | 5/2019 | Hsueh | ............... H01L 21/67359 |
| D889,941 S | 7/2020 | McCoy | |
| D902,179 S | 11/2020 | Miller et al. | |
| D964,948 S | 9/2022 | Chuang et al. | |
| D964,949 S | 9/2022 | Chuang et al. | |
| D964,950 S | 9/2022 | Chuang et al. | |
| 11,442,370 B2 * | 9/2022 | Chuang | ............ H01L 21/67386 |
| 2008/0254377 A1 | 10/2008 | Chen | |
| 2010/0038264 A1 | 2/2010 | Balix | |
| 2021/0047094 A1 | 2/2021 | Chuang | |
| 2023/0333463 A1 | 10/2023 | Wang et al. | |
| 2024/0096670 A1 | 3/2024 | Wiseman et al. | |
| 2024/0160098 A1 | 5/2024 | Raschke et al. | |

FOREIGN PATENT DOCUMENTS

| | | |
|---|---|---|
| JP | 2013224169 A | 10/2013 |
| TW | I666510 B | 7/2019 |
| TW | D210557 S | 3/2021 |

* cited by examiner

*Primary Examiner* — Bryon P Gehman

(57) ABSTRACT

A spacer for parts of a reticle pod includes spacer contacts configured to contact alignment features of a cover and a baseplate of the reticle pod such that the cover and baseplate are separated by a gap. The spacer includes a frame connecting at least two of the spacer contacts. The frame can include a spring arm allowing deformation such that the spacer contacts can be moved relative to one another to facilitate interfacing with the alignment features. The spacer contacts can be configured to surround pins included in the alignment features. The spacer contacts can be configured to be inserted into lead-in portions of channels included in the alignment features.

20 Claims, 6 Drawing Sheets

PERIMETER FRAME FOR SPACING RETICLE PODS

FIELD

This disclosure is directed to reticle pods including spacers and spacers connected by frames for spacing sealing surfaces of reticle pods apart from one another.

BACKGROUND

Reticle containers can include hard sealing surfaces. When reticle containers are shipped, they are typically shipped in their complete assembled state. During shipping, the sealing surfaces may be subject to shock and/or vibration in excess of ordinary handling and operations for the reticle pod, leading to wear, damage, and particle generation that can affect the cleanliness or other performance of the reticle pod.

SUMMARY

This disclosure is directed to reticle pods including spacers and spacers connected by frames for spacing sealing surfaces of reticle pods apart from one another.

By providing spacers that interface with alignment features of a reticle container, such as an inner pod of a reticle pod, a gap can be maintained between the sealing surfaces while the reticle pod is shipped in the assembled state. The presence of such a gap can reduce or eliminate wear or damage resulting from shocks or vibration experienced during shipping of the reticle container. The gap can be sized such that the reticle container can still be completely assembled, for example having an inner pod be contained within the outer pod of the complete reticle container during such shipping. This allows reticle containers to be shipped with reduced risk of damage or particle generation, even when shipped as complete containers. Further, the contacts of the spacer can be joined by a frame to facilitate handling. The frame can be configured such that is runs outside a perimeter of the sealing surfaces of the reticle container, reducing the likelihood of wear particles from the spacer from causing cleanliness issues in the reticle pod.

In an embodiment, a spacer for a reticle pod includes a plurality of spacing contacts. Each of the spacing contacts configured to contact a first reticle pod segment at a first reticle pod alignment feature and to contact a second reticle pod segment at a second reticle pod alignment feature. The first reticle pod alignment feature is separate from a first sealing surface of the first reticle pod segment, and the second reticle pod alignment feature is separate from a second sealing surface of the second reticle pod segment. The spacer includes a frame joining at least two of the plurality of spacing contacts. The frame is configured to be outside the first sealing surface and the second sealing surface in plan view of the reticle pod. The spacing contacts are configured to contact the first reticle pod segment and the second reticle pod segment such that the first reticle pod segment and the second reticle pod segment are separated by a gap.

In an embodiment, the plurality of spacing contacts includes at least three of the spacing contacts.

In an embodiment, the frame joins all of the spacing contacts of the plurality of spacing contacts.

In an embodiment, the frame comprises at least one spring arm configured to allow deflection of the frame such that a distance between the plurality of spacing contacts is varied.

In an embodiment, each of the spacing contacts includes an inner surface defining an opening configured to receive the first reticle pod alignment feature, and an outer surface configured to be received within the second reticle pod alignment feature.

In an embodiment, the gap has a width in a range from 20 µm to 1 mm.

In an embodiment, the spacer includes at least one of polycarbonate and a polyolefin.

In an embodiment, a reticle pod includes an inner pod including a cover and a baseplate/The cover includes a cover sealing surface and a plurality of cover alignment features separate from the cover sealing surface. The baseplate includes a baseplate sealing surface and a plurality of baseplate alignment features separate from the baseplate sealing surface. The reticle pod includes a spacer. The spacer includes a plurality of spacing contacts. Each of the spacing contacts is configured to contact one of the plurality of cover alignment features and to contact one of the plurality of baseplate alignment features. The spacer includes a frame joining at least two of the plurality of spacing contacts, the frame configured to be outside the cover sealing surface and the baseplate sealing surface in plan view of the reticle pod. The spacing contacts are configured to contact the cover and the baseplate such that the cover and the baseplate are separated by a gap.

In an embodiment, the plurality of spacing contacts includes at least three of the spacing contacts.

In an embodiment, the frame joins all of the spacing contacts of the plurality of spacing contacts.

In an embodiment, the frame comprises at least one spring arm configured to allow deflection of the frame.

In an embodiment, the cover alignment feature is a pin and the baseplate alignment feature is a channel configured to receive the pin, the channel including a lead-in.

In an embodiment, each of the spacing contacts includes an inner surface defining an opening configured to receive the pin, and an outer surface configured to be received within the lead-in.

In an embodiment, the gap has a width in a range from 20 µm to 1 mm.

In an embodiment, the reticle pod further includes an outer pod including a pod dome and a pod door, the outer pod configured to accommodate the inner pod.

In an embodiment, a method of preparing a reticle pod for shipment includes assembling an inner pod including a cover, a baseplate, and a spacer provided between the cover and the baseplate. The spacer includes a plurality of spacing contacts contacting the cover at cover alignment features. The spacer contacts the baseplate at baseplate alignment features. The spacer includes a frame joining at least two of the plurality of spacing contacts. The cover and the baseplate are separated by a gap.

In an embodiment, the frame includes a deflection arm, and assembling the inner pod includes deflecting the frame at the deflection arm to align at least one of the plurality of spacing contacts with one of the cover alignment features or one of the baseplate alignment features.

In an embodiment, the gap has a width in a range from 20 µm to 1 mm.

In an embodiment, the cover alignment features are each a pin, the baseplate alignment features are each a channel including a lead-in, and assembling the inner pod includes passing each of the pins through one of the spacing contacts, and inserting each of the spacing contacts into one of the lead-ins.

In an embodiment, the method further includes placing the inner pod into an outer pod, the outer pod including a pod dome and a pod door, joining the pod dome to the pod door to enclose the inner pod, and shipping the reticle pod from a packing location to a destination location while the pod dome is joined to the pod door.

DRAWINGS

DETAILED DESCRIPTION

This disclosure is directed to reticle pods including spacers and spacers connected by frames for spacing sealing surfaces of reticle pods apart from one another.

Figure 1:
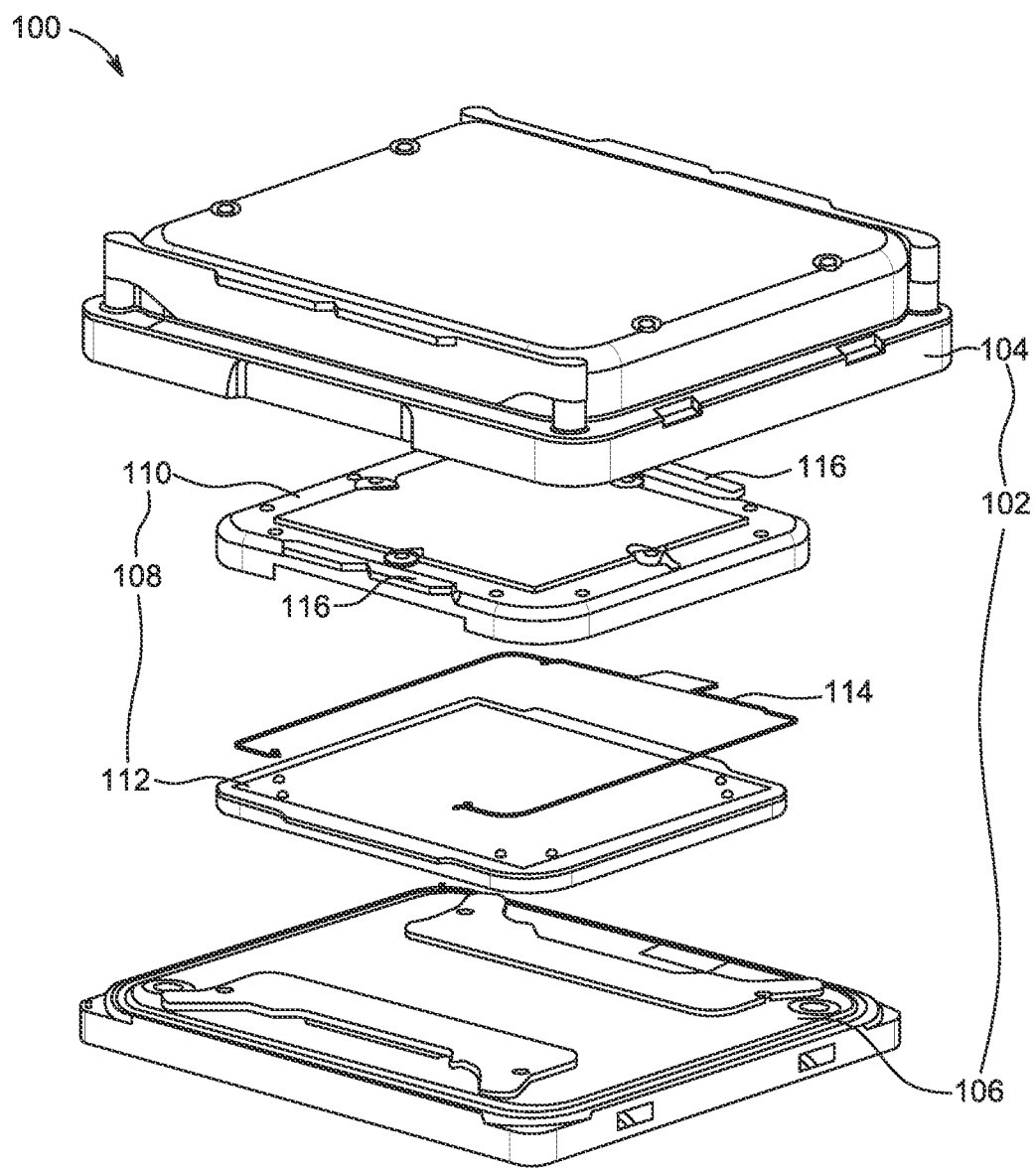
FIG. 1 shows a reticle container according to an embodiment.

FIG. 1 shows a reticle container according to an embodiment. Reticle container 100 includes outer pod 102 including pod dome 104 and pod door 106. Reticle container 100 also includes inner pod 108, including cover 110 and baseplate 112. Reticle container 100 further includes spacer 114.

Outer pod 102 forms an exterior of reticle container 100. Outer pod 102 is configured to accommodate inner pod 108. When reticle container 100 is shipped to a destination or stored at a location, the reticle container can be assembled with the inner pod 108 contained within the outer pod 102. The outer pod 102 can be composed of pod dome 104 and pod door 106.

Inner pod 108 is an inner pod of reticle container 100, configured to accommodate a reticle. The inner pod includes cover 110 and baseplate 112. Cover 110 and baseplate 112 can be configured to contact one another during typical use, for example at corresponding sealing surfaces provided on each of cover 110 and baseplate 112. Cover 110 and baseplate 112 can be made of metal materials, and further can have metal plating, for example at least at some of the sealing surfaces. The cover 110 and baseplate 112 can be spaced apart from one another at other times, for example during storage or shipment, for example using one or more of spacer 114.

Spacer 114 can be included in reticle container 100 to space cover 110 and baseplate 112 apart from one another when inner pod 108 is assembled. The spacer 114 can include one or more spacing contacts configured to engage with features included in cover 110 and baseplate 112. The features can be any suitable features disposed outwards of sealing surfaces included in the cover 110 and baseplate 112. The features can be between an outer perimeter of the sealing surfaces and an outer perimeter of the respective over 110 or baseplate 112. Non-limiting examples of such features include alignment features, ledges, shelves, projections, flanges, combinations thereof, and the like provided on the cover 110 and the baseplate 112. The features that the spacer 114 engage with are disposed on parts of the cover 110 and/or baseplate 112 that are outside of sealing surfaces. Outside of the sealing surfaces means that the features engaged with and the position of the frame of spacer 114 do not overlap with the sealing surfaces of cover 110 or baseplate 112 in plan view when the cover 110 and baseplate 112 are assembled with spacer 114. The spacer 114 can contact the cover 110 and the baseplate 112 such that the respective sealing surfaces remain separated by a gap. In an embodiment, the gap can be maintained when the cover 110 and the baseplate 112 are assembled with spacer 114 in place and placed into the outer pod 102. When inner pod 108 is placed in outer pod 102 and outer pod 102 is closed, the gap can have a size of between 20 micrometer (μm) and 1 millimeter (mm). In an embodiment, the spacer 114 can include one or more spring members configured to increase a size of the gap when inner pod 108 is not contained in outer pod 102, relative to the size of the gap maintained when inner pod 108 is contained within the outer pod 102.

Optionally, cover 110 can include cover flanges 116. Cover flanges 116 project outwards from sides of the cover 110. The cover flanges 116 can provide a point where spring members included in spacer 114 can contact the cover 110 to provide the increase in gap size when the cover 110 and baseplate 112 are not contained within outer pod 102.

Figure 2A:
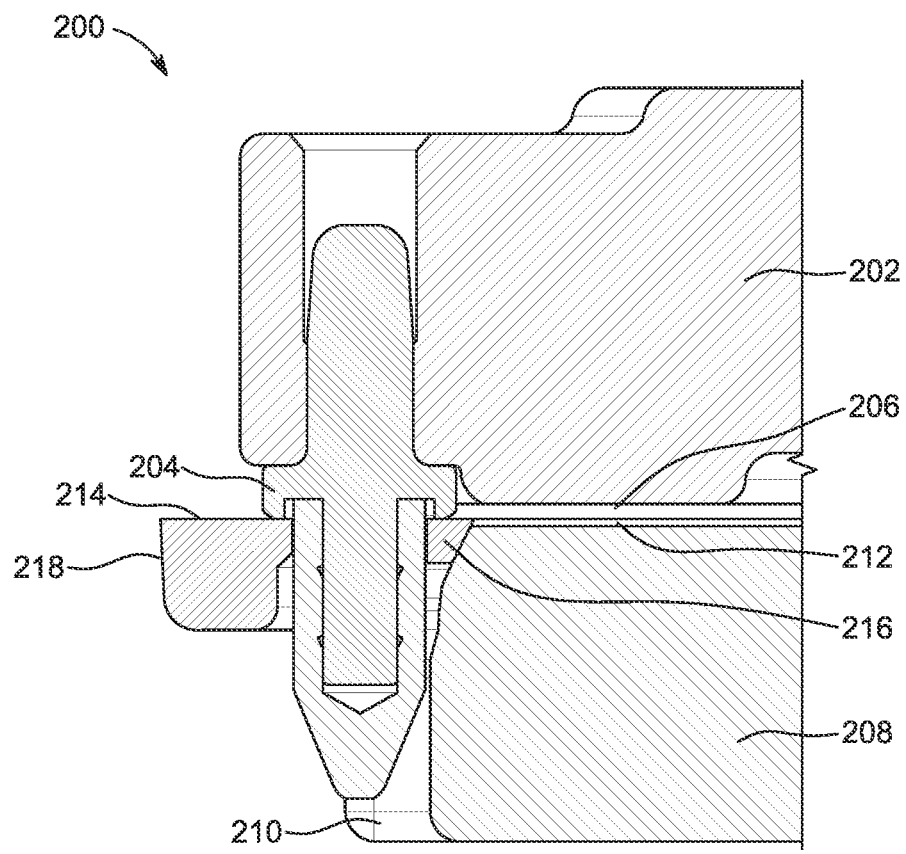
FIG. 2A shows a sectional view of an inner pod of a reticle container according to an embodiment.

FIG. 2A shows a sectional view an inner pod of a reticle container according to an embodiment. Inner pod 200 includes cover 202 including cover alignment features 204 and cover sealing surface 206. Inner pod 200 also includes baseplate 208 including baseplate alignment features 210 and baseplate sealing surface 212. Spacer 214 includes spacing contacts 216 and frame 218.

Cover 202 is a cover of the inner pod 200. Cover 202 is configured to combine with baseplate 208 to define an internal space capable of accommodating a reticle. The cover 202 can be configured to form an upper portion of the inner pod 200. The cover 202 includes cover alignment features 204. The cover alignment features can be any suitable features provided in cover 204 to provide alignment of cover 202 with baseplate 208, for example by engagement between the cover alignment features 204 with suitable baseplate alignment features 210. In the embodiment shown in FIG. 2, the cover alignment features 204 include a plurality of pins protruding from the cover 202. In embodiments, the cover alignment features can instead be recesses or openings configured to receive pins provided as the baseplate alignment features 210 or any other suitable structure for guiding and/or maintaining alignment of cover 202 with baseplate 208. Cover 202 also includes cover sealing surface 206. Cover sealing surface 206 is a surface of cover 202 configured to contact the baseplate 208 when inner pod 200 is assembled for typical use such as containing a reticle. The cover sealing surface 206 can be one or more surfaces positioned to correspond to baseplate sealing surface 212 when inner pod 200 is assembled.

Baseplate 208 forms another portion of inner pod 200. The baseplate 208 is configured to, when combined with cover 202, define an internal space capable of accommodating a reticle. Baseplate 208 includes baseplate alignment features 210. In the embodiment shown in FIG. 2, the baseplate alignment features 210 are holes formed in baseplate 208, configured to receive the pins that are cover alignment features 204. The holes include lead-ins having a diameter larger than the diameter of the pins. The baseplate 208 further includes baseplate sealing surface 212. Baseplate sealing surface 212 is configured to contact cover sealing surface 206 when the inner pod 200 is assembled, for example to contain a reticle. The baseplate sealing surface 212 can oppose the corresponding cover sealing surface 206.

Spacer 214 includes spacing contacts 216 joined by frame 218. In the embodiment shown in FIG. 2, spacing contacts 216 are each configured to contact the cover 202 and the baseplate 208 at the respective cover alignment features 204 and baseplate alignment features 210. It is understood that the position and shape of spacing contacts 216 can be any suitable configuration for engaging the features of the cover 202 and the baseplate 208 outside of the respective cover sealing surface 206 and the baseplate sealing surface 212 so as to space the sealing surfaces 206, 212 apart from one another. For example, tabs engaging ledges or shelves can be used as the spacing contacts 216 in embodiments contacting the cover 202 and/or the baseplate 208 at such ledges or shelves. Spacing contacts 216 are configured to contact the cover alignment features 204 and the baseplate alignment features 210 such that cover sealing surfaces 206 and baseplate sealing surfaces 212 are spaced apart from one another by a gap. In the embodiment shown in FIG. 2, the spacing contacts 216 are each ring-shaped and include an inner surface defining a bore configured to receive one the pins of the cover alignment feature 204. The spacing contacts 216 each further include an outer surface configured to be received in one of the lead-ins of the holes of the baseplate alignment features 210. The contact between the spacing contacts 216 and the cover and baseplate alignment features 204, 210 can hold cover 202 apart from baseplate 208 such that a gap separates the cover sealing surface 206 and the baseplate sealing surface 212. In an embodiment, the number of spacing contacts 216 corresponds to the number of matched cover and baseplate alignment features 204, 210 included in inner pod 200. In an embodiment, the number of spacing contacts 216 is less than the number of matched cover and baseplate alignment features 204, 210 included in inner pod 200. The spacer 214 can be installed, for example, for shipping of inner pod 200, to prevent contact between the cover and baseplate sealing surfaces 206, 212 during such shipment or storage of inner pod 200. The spacer 214 can be configured to maintain separation between cover 202 and baseplate 208 even when the inner pod 200 is placed into an outer pod, such as outer pod 102 described above and shown in FIG. 1, and the outer pod is closed. Spacer 214 can include a frame joining two or more of the spacing contacts. Frame 218 can be configured to run outside of the cover sealing surface 206 and/or the baseplate sealing surface 212 with respect to a plan view of the inner pod 200. By avoiding the areas corresponding to the cover and baseplate sealing surfaces 206, 212, the amount of particles generated by spacer 214 and its contact with cover 202 and/or baseplate 208 contacting cover and baseplate sealing surfaces 206, 212 and the interior space defined by cover 202 and baseplate 208 can be reduced.

While cover alignment features 204 are shown as being pins and baseplate alignment features 210 are shown as channels receiving the pins in FIG. 2, it is understood that pins could be provided as the baseplate alignment features 210 and channels receiving the pins could be provided as the cover alignment features 204. It is understood that the spacer 214 can be shaped and sized appropriately to maintain the gap between cover and baseplate sealing surfaces 206, 212 by engagement with the cover alignment features 204 and baseplate alignment features 210.

Figure 2B:
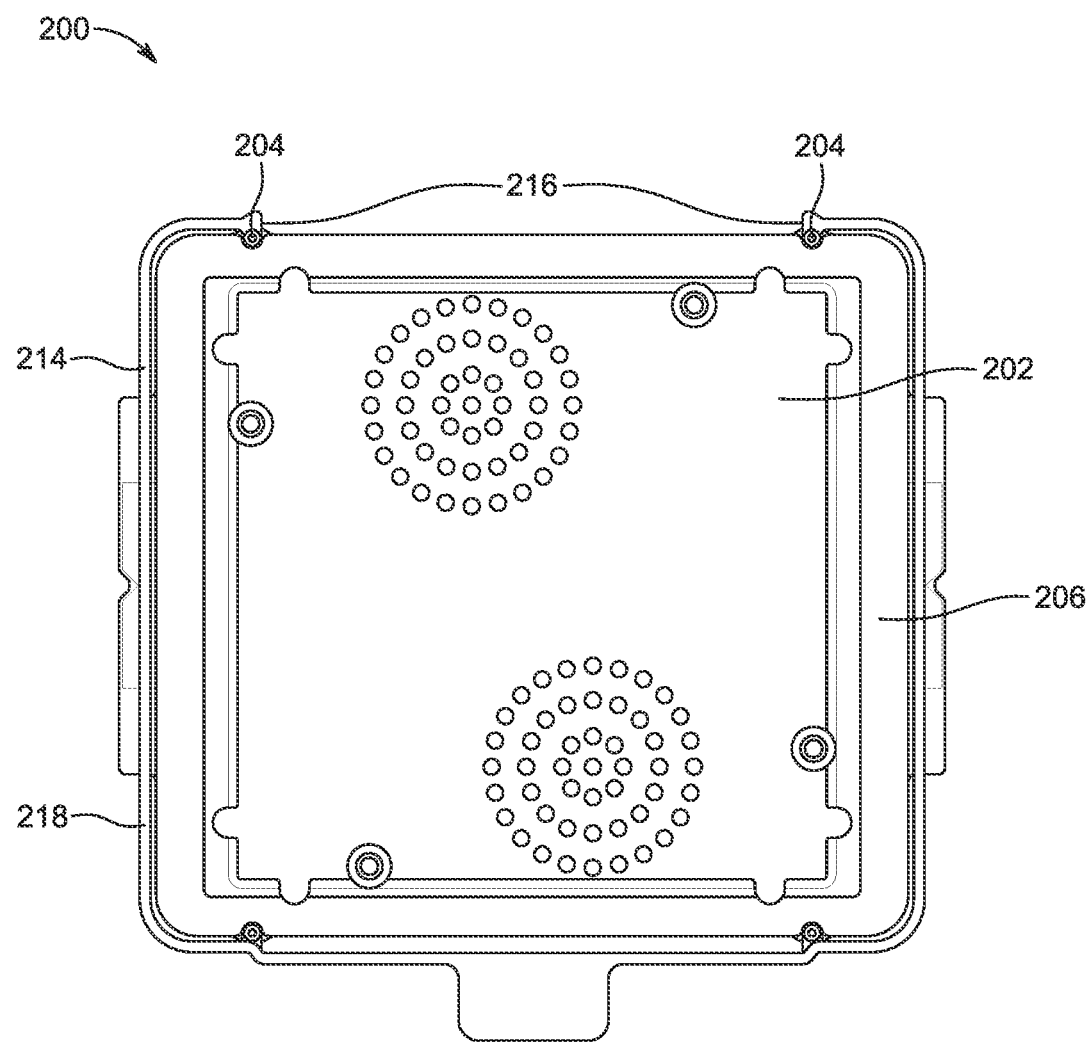
FIG. 2B shows a plan view of the cover and the spacer of FIG. 2A.

FIG. 2B shows a plan view of cover 202 when spacer 214 is installed onto cover 202. The spacing contacts 216 each surround one of cover alignment features 204. Frame 218 surrounds an exterior perimeter of the cover sealing surface 206 in the plan view of FIG. 2B, with an entirety of the frame 218 being outside the cover sealing surface 206, such that no part of frame 218 overlaps with the cover sealing surface 206. Baseplate sealing surface 212 can be positioned to correspond to cover sealing surface 206 and thus have the same relationship to frame 218 as baseplate sealing surface 212.

Figure 3:
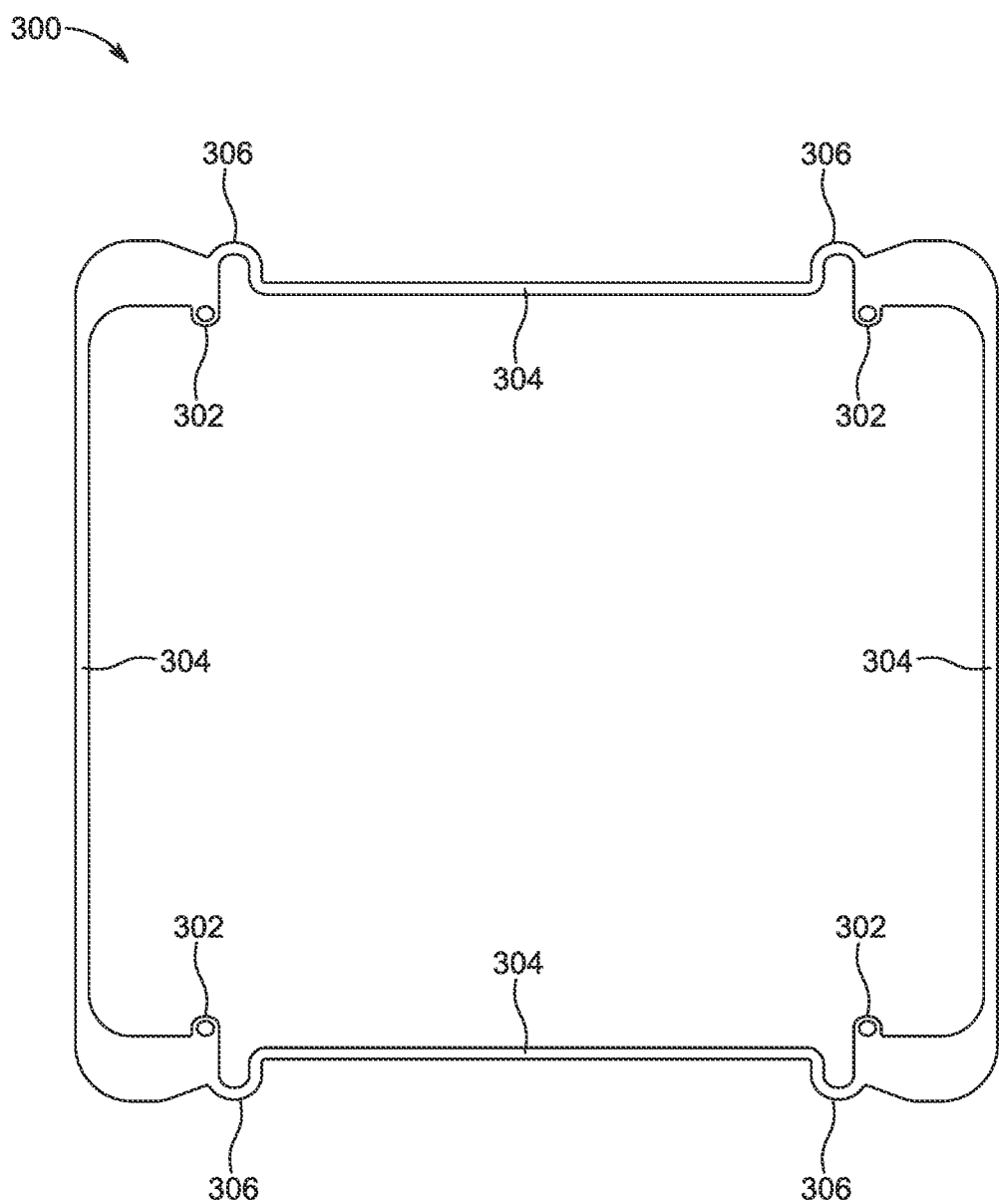
FIG. 3 shows a spacer according to an embodiment.

FIG. 3 shows a spacer according to an embodiment. Spacer 300 includes spacing contacts 302 and frame 304. Frame 304 includes spring arms 306. Spacing contacts 302 are configured to contact alignment features of a cover and a baseplate of a reticle container, such as cover alignment features 204 and baseplate alignment features 210 shown in FIG. 2 and described above. The spacing contacts 302 can be located relative to one another such that spacing contacts 302 are spaced apart by approximately the same distances as the cover and baseplate alignment features. The frame 304 can join two or more of the spacing contacts 302. The frame 304 can be configured to be outside cover and/or baseplate sealing surfaces such as sealing surfaces when spacer 300 is installed into a reticle pod and the reticle pod is viewed in plan view. The frame 304 can include spring arms 306. Spring arms 306 can be features of frame 304 allowing deflection of the frame 304 such that the relative position of spacing contacts 302 can be varied. The spring arms can be segments that vary in thickness, include bends or other such features, and/or include resilient materials such that the frame can be deflected at those spring arms 306. Any suitable number of spring arms 306 can be included in frame 304. In an embodiment, a spring arm 306 is provided in frame 304 for each of the spacing contacts 302 included in spacer 300. In an embodiment, the number of spacing contacts 302 included in spacer 300 is greater than the number of spring arms included in frame 304.

Figure 4:
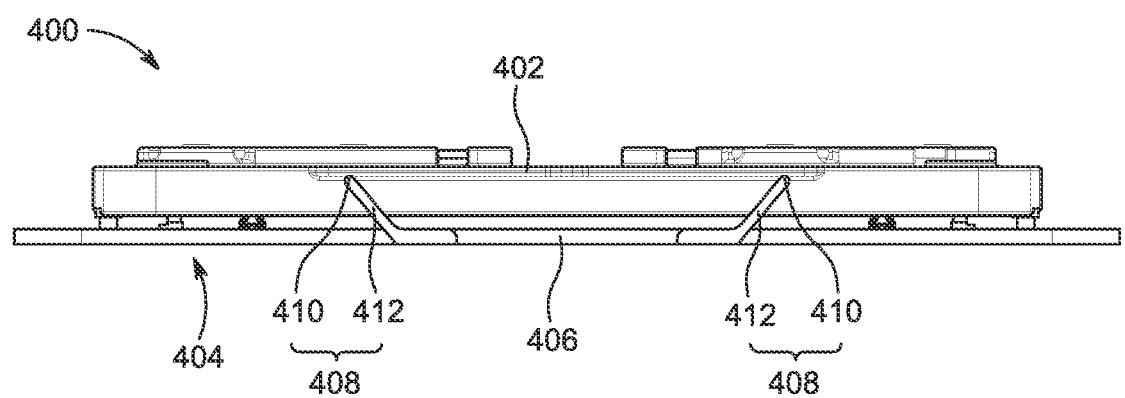
FIG. 4 shows a spacer according to an embodiment.

FIG. 4 shows a cover and a spacer according to an embodiment. Cover 400 includes cover flange 402. Spacer 404 includes spacing contacts (not shown) joined by a frame 406, and lifting arms 408. The spacing contacts can be any of the spacing contacts described above. The frame 406 can join two or more of the spacing contacts. The frame 406 can be configured to be outside cover and/or baseplate sealing surfaces when spacer 404 is installed into a reticle pod including cover 400 and the reticle pod is viewed in plan view. Lifting arms 408 can be provided on spacer 402, for example extending from the frame 406. Lifting arms 408 are positioned such that lifting contacts 410 can contact the cover or the baseplate of a reticle pod when the spacer 400 is installed into the reticle pod. The lifting contacts 410 can contact cover 400, for example at the cover flanges 402. The lifting contacts 410 can be on flexible arms 412 included in lifting arms 408. The flexible arms 412 can have a flexibility selected such that the lifting arms 408 can support the cover 400 apart from a baseplate when spacer 404 is installed into the inner pod of a reticle pod by itself. The flexible arms can be configured to deflect when the cover and baseplate are pressed together, for example when the cover and the baseplate are placed within an outer pod such as outer pod 102 described above and shown in FIG. 1. The flexible arms can result in there being a first gap between the sealing surfaces of the cover 400 and the baseplate when an inner pod having spacer 404 installed is contained within an outer pod of a reticle pod, and a second gap, larger than the first, when the inner pod having spacer 404 installed is removed from the outer pod but the cover 400 and baseplate remain together. The larger second gap can reduce the likelihood of contact between cover 400 and baseplate sealing surfaces during unpacking of the inner pod and removal of the spacer 404, for example following shipment of a reticle pod in which spacer 404 is used to separate the cover 400 and the baseplate during shipping.

Figure 5:
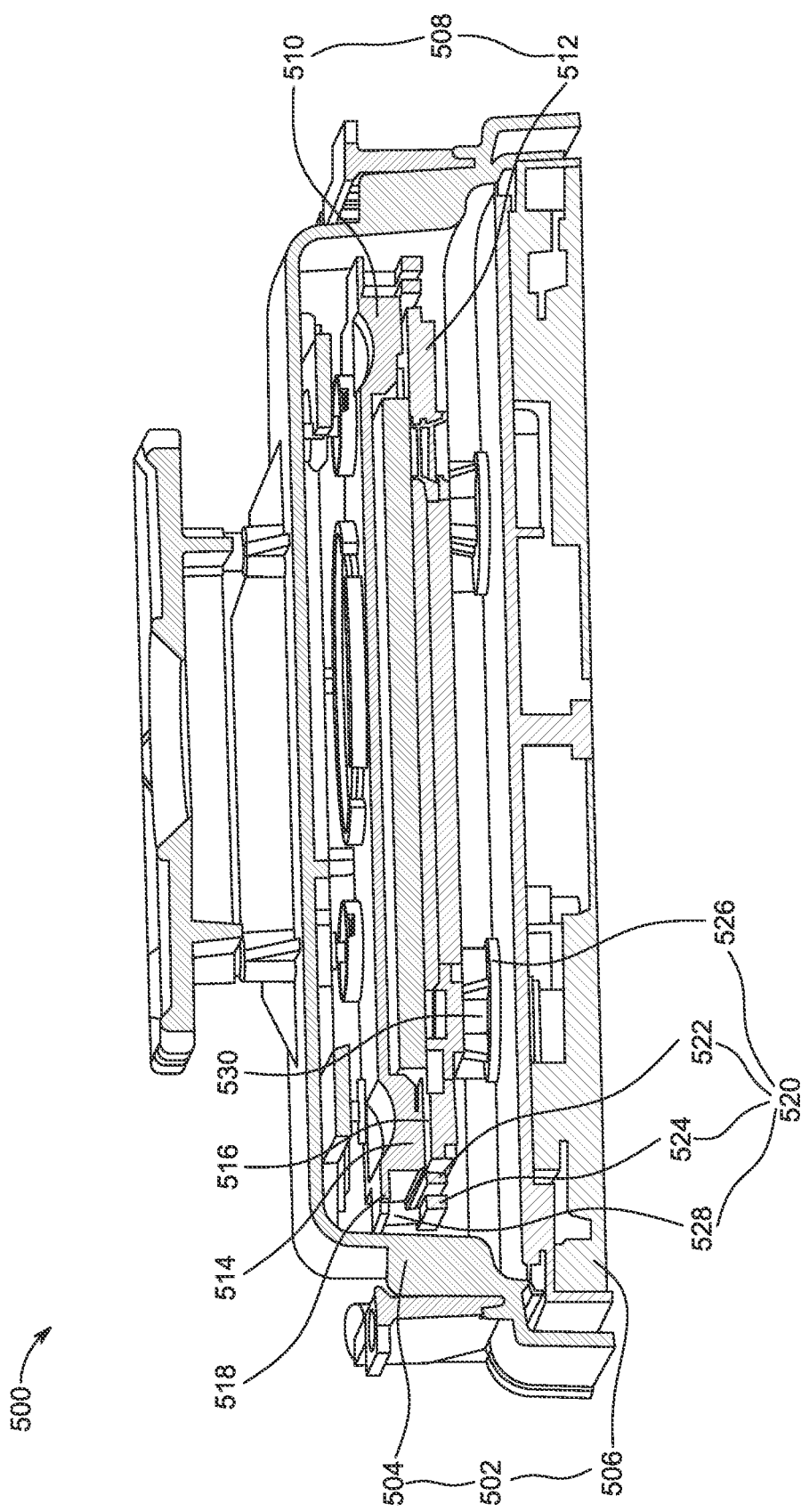
FIG. 5 shows a reticle pod according to an embodiment.

FIG. 5 shows a reticle pod according to an embodiment. Reticle pod 500 includes outer pod 502 including pod dome 504 and pod door 506. Reticle pod 500 further includes inner pod 508, which includes cover 510 and baseplate 512. Cover 510 includes cover sealing surface 514 and cover flanges 518. Baseplate 512 includes baseplate sealing surface 516. Spacer 520 can be installed into the outer pod 502 and engage with inner pod 508 so as to provide a gap between the cover sealing surface 514 and baseplate sealing surface 516. The spacer 520 can include a first spacer frame 522, a second spacer frame 524, anchors 526, and cover supports 528. The anchors 526 can attach to support posts 530 included in pod door 506.

Outer pod 502 is an outer pod of reticle pod 500 configured to define an internal space capable of accommodating inner pod 508. Outer pod 502 includes pod dome 504 and pod door 506, which combine to define the internal space. Pod door 506 can be joined to pod dome 504 by any suitable connection, such as latching mechanisms or the like. The pod door 506 can include support posts 530. Support posts 530 can be configured to contact the inner pod 508, for example at baseplate 512, so as to position the inner pod 508 within the internal space of outer pod 502.

Inner pod 508 is an inner pod of reticle pod 500 configured to accommodate a reticle. Inner pod 508 includes cover 510 and baseplate 512. Cover 510 and baseplate 512 can include any suitable features of covers and baseplates included herein, such as, as a non-limiting example, the cover and baseplate alignment features 204, 210 as discussed above and shown in FIGS. 2A and 2B. Cover 510 and baseplate 512 respectively include cover sealing surface 514 and baseplate sealing surface 516. The cover sealing surface 514 and the baseplate sealing surface 516 are surfaces respectively provided on cover 510 and baseplate 512 so as to form a seal when the inner pod 508 is assembled in the absence of spacer 520, for example, when inner pod 508 is accommodating a reticle. The sealing can be a seal based on contact of the cover and baseplate sealing surfaces 514, 516, close proximity allowing generation of a pressure differential between an inside and an exterior of the inner pod 508, or any other suitable sealing of the inner pod 508. When spacer 520 is used in reticle pod 500, the cover sealing surface 514 and baseplate sealing surface 516 can be spaced apart by a gap. The gap can be maintained by the presence of spacer 520 and its engagement with parts of reticle pod 500, such as the pod dome 504, pod door 506, cover 510, and/or baseplate 512. The gap can have any suitable size to reduce or eliminate contact between the cover and baseplate sealing surfaces 514, 516 while allowing the inner pod 508 to still be accommodated within the outer pod 502. In an embodiment, the gap can have a size of between 20 micrometer ($\mu m$) and 1 millimeter (mm). Spacer 520 can be installed into reticle pod 500 to provide and maintain the gap, for example, during transportation and/or storage of the reticle pod 500. The maintenance of the gap can reduce or eliminate rubbing friction, and in turn reduce wear and accompanying particle generation at the inner pod 508. The maintenance of the gap can also reduce the likelihood or extent of damage resulting from contact between the cover 510 and baseplate 512 due to shocks occurring during transportation or storage of reticle pod 500.

In the embodiment shown in FIG. 5, the cover 510 includes cover flanges 518. The cover flanges 518 can project from opposing sides of the cover 510. The cover flanges 518 can be contacted by one or more features of the spacer 520 such that the cover 510 can be retained in a particular position within outer pod 502, for example supporting cover 510 in a particular position so as to provide the gap between cover sealing surface 514 and baseplate sealing surface 516.

Spacer 520 can be installed into the reticle pod 500 to maintain the gap between cover sealing surface 514 and baseplate sealing surface 516, for example to prevent wear or damage during the transportation and/or storage of reticle pod 500. Spacer 520 can engage with the cover 510 and baseplate 512 so as to retain the cover 510 and baseplate 512 such that the gap is maintained when reticle pod 500 is assembled. The spacer 520 can include one or more discrete structures. The spacer 520 or portions thereof can be configured to engage with pod dome 504 and/or pod door 506 so as to fix the position of spacer 520.

First spacer frame 522 is a frame configured to be outside of the cover sealing surface 514 and the baseplate sealing surface 516 when reticle pod 500 is assembled. First spacer frame 522 can include features configured to engage with is configured to position engagement features such that the engagement features can contact one of cover 510 or baseplate 512 so as to position the cover 510 or baseplate 512 such that the gap is maintained when spacer 520 is installed into reticle pod 500. The engagement features can be, for example, flanges, tabs, spacing contacts such as spacing contacts 216 described above and shown in FIG. 2B, or the like.

Second spacer frame 524 is a frame configured to be outside of the cover sealing surface 514 and the baseplate sealing surface 516 when reticle pod 500 is assembled. Second spacer frame 524 is configured to position engagement features such that the engagement features can contact one of cover 510 or baseplate 512 so as to position the cover 510 or baseplate 512 such that the gap is maintained when spacer 520 is installed into reticle pod 500. In the embodiment shown in FIG. 5, the engagement features positioned by the second spacer frame 524 can be cover supports 528. The cover supports 528 can be projections configured to contact cover flanges 530 to support cover 510 above baseplate 512 so as to maintain the gap between cover sealing surface 514 and baseplate sealing surface 516. In other embodiments, the engagement features can be, for example, flanges, tabs, spacing contacts such as spacing contacts 216 described above and shown in FIG. 2B, or the like. In an embodiment, the second spacer frame 524 is part of a continuous structure with first spacer frame 522. In an embodiment, second spacer frame 524 is part of a separate structure from the structure including first spacer frame 522.

Anchors 526 are used to connect spacer 520 or portions thereof to at least one of the pod dome 504 or pod door 506. The anchors can be configured to engage with any suitable features of the pod dome 504 or pod door 506 such that the position of the spacer 520 or portions thereof such as the first spacer frame 522 and/or second spacer frame 524 can be maintained. In the embodiment shown in FIG. 5, the anchors 526 are configured to engage with support posts 530 provided on the pod door 506. The anchors 526 can be configured to engage with features inherently included in the pod dome 504 or pod door 506 and/or features specifically included in the pod dome 504 or pod door 506 for engagement with anchors 526. The features can include any mechanical engagement features, such as posts, flanges, grooves, ledges, shoulders, and the like. In an embodiment, a first one or more anchors 526 are configured to position the first spacer frame 522, and a second one or more anchors 526 are configured to position the second spacer frame 524.

Aspects:

It is understood that any of aspects 1-7 can be combined with any of aspects 8-15 or aspects 16-20. It is understood that any of aspects 8-15 can be combined with any of aspects 16-20.

Aspect 1. A spacer for a reticle pod, comprising:
a plurality of spacing contacts, each of the spacing contacts configured to contact a first reticle pod segment at a first reticle pod feature and to contact a second reticle pod segment at a second reticle pod feature, wherein the first reticle pod feature is outside of a first sealing surface of the first reticle pod segment, and the second reticle pod feature is outside of a second sealing surface of the second reticle pod segment; and
a frame joining at least two of the plurality of spacing contacts, the frame configured to be outside the first sealing surface and the second sealing surface in plan view of the reticle pod,
wherein the spacing contacts are configured to contact the first reticle pod segment and the second reticle pod segment such that the first reticle pod segment and the second reticle pod segment are separated by a gap.

Aspect 2. The spacer according to aspect 1, wherein the plurality of spacing contacts includes at least three of the spacing contacts.

Aspect 3. The spacer according to any of aspects 1-2, wherein the frame joins all of the spacing contacts of the plurality of spacing contacts.

Aspect 4. The spacer according to any of aspects 1-3, wherein the frame comprises at least one spring arm configured to allow deflection of the frame such that a distance between the plurality of spacing contacts is varied.

Aspect 5. The spacer according to any of aspects 1-4, wherein each of the spacing contacts includes an inner surface defining an opening configured to receive the first reticle pod feature, and an outer surface configured to be received within the second reticle pod feature.

Aspect 6. The spacer according to any of aspects 1-5, wherein the gap has a width in a range from 20 µm to 1 mm.

Aspect 7. The spacer according to any of aspects 1-6, wherein the spacer includes at least one of polycarbonate and a polyolefin.

Aspect 8. A reticle pod, comprising:
an inner pod including a cover and a baseplate, the cover including a cover sealing surface and a plurality of cover features outside of the cover sealing surface, the baseplate including a baseplate sealing surface and a plurality of baseplate features outside of the baseplate sealing surface; and
a spacer, the spacer including:
a plurality of spacing contacts, each of the spacing contacts configured to contact one of the plurality of cover features and to contact one of the plurality of baseplate features; and
a frame joining at least two of the plurality of spacing contacts, the frame configured to be outside the cover sealing surface and the baseplate sealing surface in plan view of the reticle pod, wherein the spacing contacts are configured to contact the cover and the baseplate such that the cover and the baseplate are separated by a gap.

Aspect 9. The reticle pod according to aspect 8 wherein the plurality of spacing contacts includes at least three of the spacing contacts.

Aspect 10. The reticle pod according to any of aspects 8-9, wherein the frame joins all of the spacing contacts of the plurality of spacing contacts.

Aspect 11. The reticle pod according to any of aspects 8-10, wherein the frame comprises at least one spring arm configured to allow deflection of the frame.

Aspect 12. The reticle pod according to any of aspects 8-11, wherein the cover feature is a pin and the baseplate feature is a channel configured to receive the pin, the channel including a lead-in.

Aspect 13. The reticle pod according to aspect 12, wherein each of the spacing contacts includes an inner surface defining an opening configured to receive the pin, and an outer surface configured to be received within the lead-in.

Aspect 14. The reticle pod according to any of aspects 8-13, wherein the gap has a width in a range from 20 µm to 1 mm.

Aspect 15. The reticle pod according to any of aspects 8-14, further comprising an outer pod including a pod dome and a pod door, the outer pod configured to accommodate the inner pod.

Aspect 16. A method of preparing a reticle pod for shipment, comprising:
assembling an inner pod including a cover, a baseplate, and a spacer provided between the cover and the baseplate, the spacer including a plurality of spacing contacts contacting the cover at cover features outside of a cover sealing surface and the spacer contacting the baseplate at baseplate features outside of a baseplate sealing surface and a frame joining at least two of the plurality of spacing contacts;
wherein the cover and the baseplate are separated by a gap.

Aspect 17. The method according to aspect 16, wherein the frame includes a deflection arm, and assembling the inner pod includes deflecting the frame at the deflection arm to align at least one of the plurality of spacing contacts with one of the cover features or one of the baseplate features.

Aspect 18. The method according to any of aspects 16-17, wherein the gap has a width in a range from 20 µm to 1 mm.

Aspect 19. The method according to any of aspects 16-18, wherein the cover features are each a pin, the baseplate features are each a channel including a lead-in, and assembling the inner pod includes passing each of the pins through one of the spacing contacts, and inserting each of the spacing contacts into one of the lead-ins.

Aspect 20. The method according to any of aspects 16-19, further comprising:
placing the inner pod into an outer pod, the outer pod including a pod dome and a pod door;
joining the pod dome to the pod door to enclose the inner pod; and
shipping the reticle pod from a packing location to a destination location while the pod dome is joined to the pod door.

The examples disclosed in this application are to be considered in all respects as illustrative and not limitative. The scope of the invention is indicated by the appended claims rather than by the foregoing description; and all changes which come within the meaning and range of equivalency of the claims are intended to be embraced therein.

What is claimed is:
1. A spacer for a reticle pod, comprising:
a plurality of spacing contacts, each of the spacing contacts configured to contact a first reticle pod segment at a first reticle pod feature and to contact a second reticle pod segment at a second reticle pod feature, wherein the first reticle pod feature is outside of a first sealing surface of the first reticle pod segment, and the second reticle pod feature is outside of a second sealing surface of the second reticle pod segment; and a frame joining at least two of the plurality of spacing contacts, wherein the spacing contacts are configured to contact the first reticle pod segment and the second reticle pod segment such that the first reticle pod segment and the second reticle pod segment are separated by a gap.

2. The spacer of claim 1, the frame is configured to be outside the first sealing surface and the second sealing surface.

3. The spacer of claim 1, wherein the frame joins all of the spacing contacts of the plurality of spacing contacts.

4. The spacer of claim 1, wherein the frame comprises at least one spring arm configured to allow deflection of the frame such that a distance between the plurality of spacing contacts is varied.

5. The spacer of claim 1, wherein each of the spacing contacts includes an inner surface defining an opening configured to receive the first reticle pod feature, and an outer surface configured to be received within the second reticle pod feature.

6. The spacer of claim 1, further comprising lifting arms extending from the frame wherein the lifting arms include flexible arms with lifting contacts.

7. A reticle pod, comprising:
an inner pod including a cover and a baseplate, the cover including a cover sealing surface and a plurality of cover features outside of the cover sealing surface, the baseplate including a baseplate sealing surface and a plurality of baseplate features outside of the baseplate sealing surface; and a spacer, the spacer including:
a plurality of spacing contacts, each of the spacing contacts configured to contact one of the plurality of cover features and to contact one of the plurality of baseplate features; and a frame joining at least two of the plurality of spacing contacts, wherein the spacing contacts are configured to contact the cover and the baseplate such that the cover and the baseplate are separated by a gap.

8. The reticle pod of claim 7 wherein the frame is configured to be outside the cover sealing surface and the baseplate sealing surface.

9. The reticle pod of claim 7, wherein the frame comprises at least one spring arm configured to allow deflection of the frame.

10. The reticle pod of claim 7, wherein the cover feature is a pin and the baseplate alignment is a channel configured to receive the pin, the channel including a lead-in.

11. The reticle pod of claim 10, wherein each of the spacing contacts includes an inner surface defining an opening configured to receive the pin, and an outer surface configured to be received within the lead-in.

12. The reticle pod of claim 7, wherein the spacer includes lifting arms extending from the frame.

13. The reticle pod of claim 12, wherein the lifting arms include flexible arms with lifting contacts positioned such that the lifting contacts can contact the cover.

14. The reticle pod of claim 7, further comprising an outer pod including a pod dome and a pod door, the outer pod configured to accommodate the inner pod.

15. A method of preparing a reticle pod for shipment, comprising:
assembling an inner pod including a cover, a baseplate, and a spacer provided between the cover and the baseplate, the spacer including a plurality of spacing contacts contacting the cover at cover features outside a cover sealing surface and the spacer contacting the baseplate at baseplate features outside a baseplate sealing surface and a frame joining at least two of the plurality of spacing contacts;

wherein the cover and the baseplate are separated by a gap.

16. The method of claim 15, wherein the frame includes a deflection arm, and assembling the inner pod includes deflecting the frame at the deflection arm to align at least one of the plurality of spacing contacts with one of the cover features or one of the baseplate features.

17. The method of claim 15, wherein the spacer includes lifting arms extending from the frame.

18. The method of claim 17, wherein the lifting arms include flexible arms with lifting contacts positioned such that the lifting contacts can contact the cover.

19. The method of claim 16, wherein the cover features are each a pin, the baseplate features are each a channel including a lead-in, and assembling the inner pod includes passing each of the pins through one of the spacing contacts, and inserting each of the spacing contacts into one of the lead-ins.

20. The method of claim 16, further comprising:
placing the inner pod into an outer pod, the outer pod including a pod dome and a pod door;

joining the pod dome to the pod door to enclose the inner pod; and shipping the reticle pod from a packing location to a destination location while the pod dome is joined to the pod door.

* * * * *